US010103300B2

(12) United States Patent
Leong et al.

(10) Patent No.: US 10,103,300 B2
(45) Date of Patent: Oct. 16, 2018

(54) METHOD OF ATTACHING A LENS TO AN LED MODULE WITH HIGH ALIGNMENT ACCURACY

(71) Applicant: KONINKLIJKE PHILIPS N.V., Eindhoven (NL)

(72) Inventors: Chee Mun Leong, Jelutong (MY); Li Lian Foong, Bayan Lepas (MY); Kwong Ho Tiong, Pulau Pinang (MY); Ruen Ching Law, Bayan Lepas (MY)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 15/306,444

(22) PCT Filed: May 12, 2015

(86) PCT No.: PCT/IB2015/053475
§ 371 (c)(1),
(2) Date: Oct. 24, 2016

(87) PCT Pub. No.: WO2015/177679
PCT Pub. Date: Nov. 26, 2015

(65) Prior Publication Data
US 2017/0047490 A1 Feb. 16, 2017

Related U.S. Application Data

(60) Provisional application No. 62/001,091, filed on May 21, 2014.

(51) Int. Cl.
*H01L 33/00* (2010.01)
*H01L 33/58* (2010.01)
(Continued)

(52) U.S. Cl.
CPC ............ *H01L 33/58* (2013.01); *H01L 33/483* (2013.01); *H01L 33/507* (2013.01); *H01L 33/54* (2013.01);
(Continued)

(58) Field of Classification Search
CPC ..... H01L 33/483; H01L 33/507; H01L 33/54; H01L 2933/005; H01L 2933/0058;
(Continued)

(56) References Cited

U.S. PATENT DOCUMENTS 7,511,313 B2   3/2009  Nakata et al.
2007/0278512 A1*  12/2007  Loh .................... B29C 45/1671
                                               257/99
(Continued)

FOREIGN PATENT DOCUMENTS

CN    2720646 Y      8/2005
WO    2011066421 A2  6/2011

OTHER PUBLICATIONS

EPO as ISA, "International Search Report and Written Opinion" dated Sep. 21, 2015 from International Appl. No. PCT/IB2015/053475, filed May 12, 2015, 10 pages.
(Continued)

*Primary Examiner* — Thanh Y Tran
(74) *Attorney, Agent, or Firm* — Volpe and Koenig, P.C.

(57) ABSTRACT

A light emitting device includes a light emitting element on a substrate, and a lens element that includes a cavity within which the light emitting element is situated, and is optically aligned with the light emitting element. A strip of adhesive that attaches the lens element to the substrate substantially surrounds the light emitting element, but includes a gap that facilitates release of material from the cavity during the attachment of the lens element to the substrate. When the lens element is placed upon the substrate, the adhesive is
(Continued)

partially cured to provide a relatively high shear strength before the light emitting device is transported or subjected to other processes. To provide compatibility with subsequent processes or applications, and to protect the light emitting element from the environment, the gap in each device is sealed with a sealing material.

19 Claims, 2 Drawing Sheets

(51) Int. Cl.
    *H01L 33/48*     (2010.01)
    *H01L 33/50*     (2010.01)
    *H01L 33/54*     (2010.01)
    *F21V 17/10*     (2006.01)

(52) U.S. Cl.
    CPC ....... *F21V 17/101* (2013.01); *H01L 2933/005* (2013.01); *H01L 2933/0058* (2013.01)

(58) Field of Classification Search
    CPC .......... H01L 2924/12043; H01L 33/20–33/24; H01L 33/58–33/60
    See application file for complete search history.

(56) References Cited

U.S. PATENT DOCUMENTS

| | | | |
|---|---|---|---|
| 2008/0048200 A1* | 2/2008 | Mueller | B29C 41/14 257/98 |
| 2009/0095967 A1* | 4/2009 | Masui | H01L 33/52 257/98 |
| 2010/0181594 A1* | 7/2010 | Lin | H01L 21/486 257/99 |
| 2012/0043570 A1 | 2/2012 | Nakashima | |
| 2012/0267661 A1* | 10/2012 | Kim | H01L 33/486 257/98 |
| 2013/0056773 A1* | 3/2013 | Yang | H01L 33/60 257/98 |
| 2013/0341660 A1* | 12/2013 | Chang | H01L 33/58 257/98 |

OTHER PUBLICATIONS

Article 94(3) EPC dated Feb. 19, 2018, European Application No. 15729231.9, LUM reference 2013P02062WE, 4 pages.

* cited by examiner

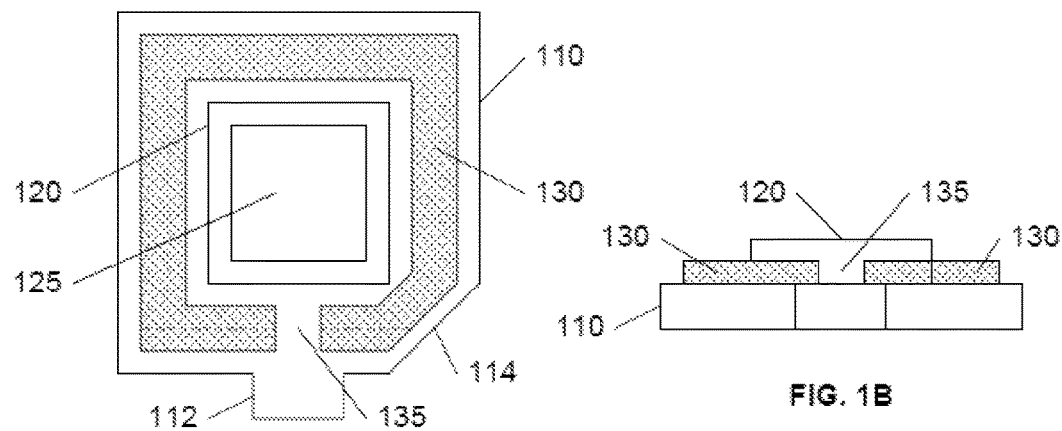
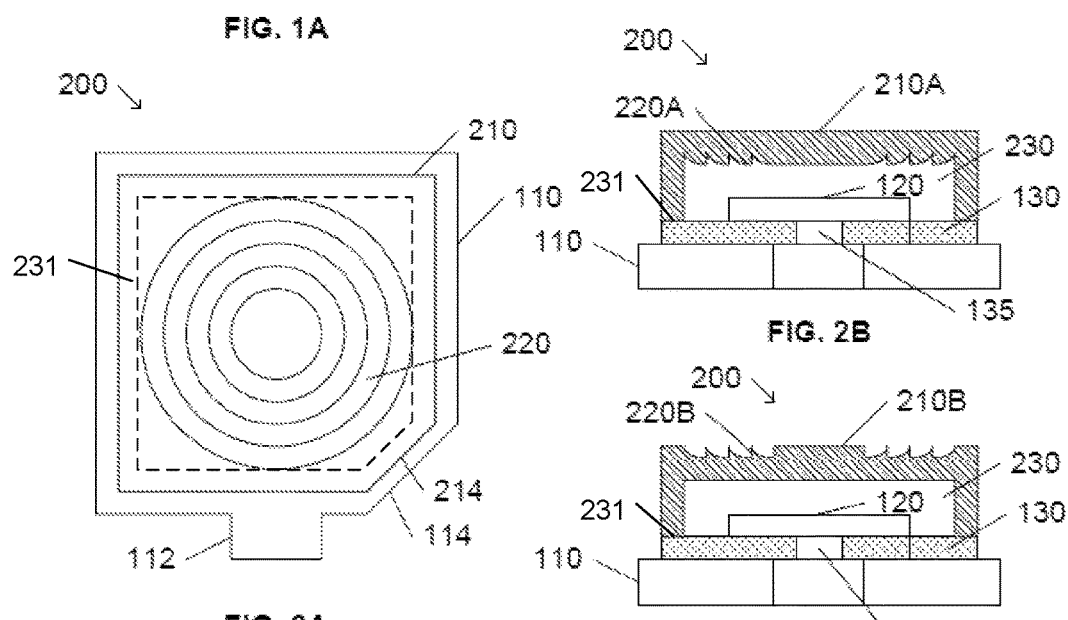
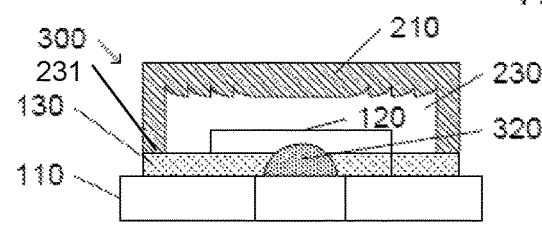

METHOD OF ATTACHING A LENS TO AN LED MODULE WITH HIGH ALIGNMENT ACCURACY

CROSS-REFERENCE TO RELATED APPLICATIONS

The present application is a § 371 application of International Application No. PCT/IB2015/053475 filed on May 12, 2015 and entitled "METHOD OF ATTACHING A LENS TO AN LED MODULE WITH HIGH ALIGNMENT ACCURACY," which claims the benefit of U.S. Provisional Application Ser. No. 62/001,091, filed May 21, 2014. PCT/IB2015/053475 and U.S. 62/001,091 are incorporated herein.

FIELD OF THE INVENTION

This invention relates to the field of light emitting devices, and in particular to light emitting devices with lens elements for applications that are enhanced by a high accuracy in the alignment of the lens element and the light emitting device.

BACKGROUND OF THE INVENTION

Light emitting devices are being used in a variety of applications. The suitability of a particular light emitting device embodiment is often a function of the projected light emission pattern. For example, automotive lamps commonly require that the light emitting device provide a light emission pattern that conforms to a given standard. In like manner, consumer applications, such as a flash element on a camera or phone device, require a substantially uniform lighting of the target image.

The quality of a given light emitting device with regard to satisfying an expressed or implied light output pattern consistency is dependent upon a variety of factors, including the alignment of the light emitting element and the lens element that provides the desired light output pattern. A misalignment of the lens element and the light emitting element may, for example, cause certain areas of a camera image to appear darker than other areas, or cause an automotive lamp to fail standards testing.

A variety of techniques are commonly used to accurately align a lens element to a light emitting element as the lens element is situated with respect to the light emitting element. For example, highly precise pick-and-place machines may be used to place each lens element at a given position relative to a light emitting element that is mounted on a substrate. In some attachment processes, an optical element on the pick-and-place machine detects the center of the light emitting element; in other processes, physical alignment features are provided on the substrate upon which the light emitting element is mounted.

However, even after the accurate placement of the lens element with respect to the light emitting element, it is often difficult to maintain their alignment during the subsequent manufacturing processes encountered in the fabrication of the finished product. Typically, the lens element is accurately positioned on the substrate that contains the light emitting element and attached via an adhesive element that is subsequently cured to fixedly attach the lens element to the light emitting element. The adhesive element also serves to isolate the light emitting element from external elements by forming a seal that surrounds the light emitting element. A number of factors, however, may affect the initially accurate alignment of the lens element and the light emitting element.

The uncured adhesive, such as an epoxy or silicone, may have low viscosity, and during the transportation of the attached lens element to the light emitting element to the equipment (e.g. oven) that cures the adhesive, excessive mechanical impact and handling may move the lens element.

Similarly, adhesives such as epoxy and silicone that are cured thermally will shrink when the crosslink (cure) occurs, which may introduce a shift in the location of the lens element relative to the light emitting element.

In like manner, air that may be trapped inside the lens element during the lens element attachment process may exert non-uniform forces that cause a shift in the position of the lens element; and, during the cure of the adhesive, which usually involves heat, the trapped air will likely expand and create steam pressure inside the lens element, which may also introduce an unpredictable force that may alter the lens element's position relative to the light emitting element.

Each of these potential movements of the lens element, and other factors, will likely introduce a misalignment of the lens element and the light emitting element.

SUMMARY OF THE INVENTION

It would be advantageous to provide a method and system for attaching a lens element to a light emitting element that is relatively unaffected by the subsequent processes applied to such an attached structure. It would also be advantageous to provide such a method and system without introducing a substantial manufacturing complexity or cost.

To better address one or more of these concerns, in an embodiment of this invention, the light emitting device of this invention includes a light emitting element on a substrate, and a lens element that includes a cavity within which the light emitting element is situated. A strip of adhesive attaches the lens element to the substrate. The adhesive is situated around the perimeter of the lens element, but includes a gap in the perimeter that enables the release of material (e.g. heated air) from beneath the lens element during the attachment of the lens element to the substrate. When the lens element is placed upon the substrate, the adhesive is partially cured to provide a relatively high shear strength before the light emitting device is transported or subjected to other processes. To provide compatibility with subsequent processes or applications, the gap in the perimeter is sealed with a sealing material.

BRIEF DESCRIPTION OF THE DRAWINGS

The invention is explained in further detail, and by way of example, with reference to the accompanying drawings wherein:

FIGS. 1A-1B illustrate an example substrate upon which a light emitting element and an adhesive strip substantially surrounding the light emitting element.

FIGS. 2A-2C illustrate views of an example lens element situated on the substrate of FIGS. 1A-1B.

FIG. 3 illustrates an example light emitting device that includes sealing material that seals a gap in an adhesive strip that attaches a lens element to a substrate of the light emitting device.

FIG. 4 illustrates an example flow diagram for forming a light emitting device with a Throughout the drawings, the same reference numerals indicate similar or corresponding features or functions. The

DETAILED DESCRIPTION

Figure 4:
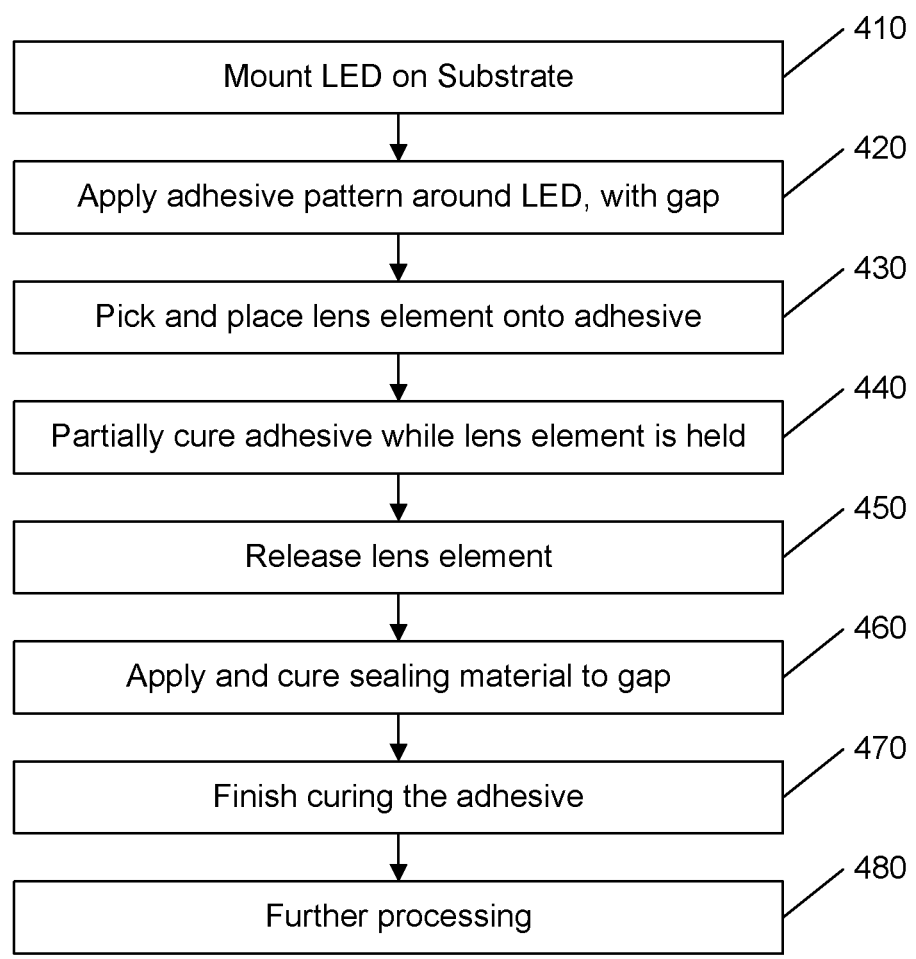

In the following description, for purposes of explanation rather than limitation, specific details are set forth such as the particular architecture, interfaces, techniques, etc., in order to provide a thorough understanding of the concepts of the invention. However, it will be apparent to those skilled in the art that the present invention may be practiced in other embodiments, which depart from these specific details. In like manner, the text of this description is directed to the example embodiments as illustrated in the Figures, and is not intended to limit the claimed invention beyond the limits expressly included in the claims. For purposes of simplicity and clarity, detailed descriptions of well-known devices, circuits, and methods are omitted so as not to obscure the description of the present invention with unnecessary detail.

FIG. 1A illustrates a top view, and FIG. 1B illustrates a profile view of an example light emitting element 120 disposed upon a substrate 110. An adhesive strip 130 surrounds the light emitting element 120, except for a gap 135. Light emitting element 120 may have a top surface, a bottom surface and multiple side surfaces. The bottom surface of light emitting element 120 is attached to substrate 110.

The substrate 110 may be a section of a larger substrate (not illustrated) that includes a plurality of light emitting elements similarly situated on sections of the larger substrate. In this manner, the subsequently described process may be applied to all of the sections of the larger substrate concurrently, followed by a slicing/dicing of the larger substrate to form individual/singulated light emitting devices.

In this example embodiment, there is a gap 135 in the adhesive strip 130, such that the adhesive strip does not completely surround the light emitting element 120. This adhesive strip may be applied using an adhesive stamp tool, common in the art, to transfer adhesive to the substrate 110 in the desired pattern around the light emitting element 120. Although a single gap 135 in the adhesive strip 130 is illustrated, multiple gaps may also be provided.

The example light emitting element 120 includes a light emitting surface 125 from which light is emitted; this surface 125 may include some or all of the top surface of the light emitting element 120. In this embodiment, the light emitting element 120 is fixedly attached to the substrate 110 at a known location on the substrate, and thereby the location of the light emitting surface 125 is at a known location relative to the substrate 110.

The substrate 110 may include one or more alignment features 112, 114 that facilitate the alignment of elements upon the substrate 110, as well as the alignment of the substrate 110 on other items, including for example, substrates, printed circuit boards, lamp fixtures, and the like. Accordingly, because the location of the light emitting surface with respect to the substrate is known, the location of the light emitting surface 125 with respect to other elements on the substrate 110, or other items upon which the substrate 110 is mounted, is known. One of skill in the art will recognize that although explicit features 112, 114 are illustrated in the example substrate, inherent features of the substrate 110, such as its edges, corners, and so on, may be used as alignment features, obviating the need for such explicit features 112, 114. Likewise only a single alignment feature 112 or 114 may be used.

Alternatively, as noted above, the machine that places the lens on the substrate may provide alignment by optically detecting features of the light emitting element, without the need of physical alignment elements.

FIGS. 2A-2C illustrate views of an example light emitting device 200 that includes lens element 210 (alternate implementations 210A, 210B) situated on the substrate 110 of FIGS. 1A-1B. FIG. 2A shows a top view of lens element 210 which may be lens element 210A shown in FIG. 2B or lens element 210B shown in FIG. 2C.

The lens element 210 includes a cavity 230 within which the light emitting element 120 is situated, and a bottom surface 231 for mounting the light emitting element. The lens element 210 is shaped or patterned to alter the direction of the light that is emitted from the light emitting element 120. In the examples of FIGS. 2A-2C, the lens element 210 includes a pattern 220 (alternate patterns 220A, 220B) that provides a collimation of the light that is emitted from the light emitting element 120. The lens element may alternatively be inverse-parabolic shaped, for example, to provide a collimation, or spherically shaped to provide a divergence of the light that is emitted from the light emitting element 120 or any other suitable shape.

In FIG. 2B, the pattern 220A is formed on an interior surface of cavity 230 of the lens element 210, whereas in FIG. 2C, the pattern 220B is formed on the exterior surface of the lens element 210.

The example lens element 210 includes one or more features 214 that facilitate the alignment of the lens element 210 and the substrate 110. In this example, the alignment feature 214 on the lens element 210 corresponds to the alignment feature 114 on the substrate 110. One of skill in the art will recognize, however, that any inherent feature of the lens element 210, such as its sides, corners, and so on, may be used to align with the inherent features of the substrate 110, such as its sides, corners, and so on.

With a proper alignment of the lens element 210 and the substrate 110, and the aforementioned known location of the light emitting element 120 on the substrate 110, the proper alignment of the lens element 210 and the light emitting element 120 is assured.

As noted above, one of skill in the art will recognize that 'non-mechanical' means may be used to align the lens element 210 and the light emitting element 120, such as using optical pattern recognition to recognize the center of the light emitting surface 125 and controlling the placement of the lens element 210 accordingly.

Although the lens element 210 may be accurately placed on the substrate 110 to provide an accurate alignment of the lens element 210 with respect to the light emitting element 120 in this combination (hereinafter termed the light emitting device 200), this initial placement of the elements 110, 120, 210 forming the light emitting device 200 may be affected by the subsequent transport or other processing of the combination 110, 120, 210, as noted above.

To avoid a misalignment due to transport or other mechanical effects, the adhesive 130 should create a bond with relatively high shear strength before the light emitting device is transported or otherwise mechanically or environmentally affected. To provide such a relatively high shear strength, the adhesive may be partially cured, in situ, immediately after the lens element 210 is initially situated on the substrate 110. To further assure alignment, the partial curing may be performed while the mechanism that is used to place the lens element 210 at its proper position on the substrate 110 is still attached to the lens element 210.

Adhesives that are commonly used in manufacture generally have a relatively long cure time at room temperature, to allow time for the attachment of elements to the substrate after the adhesive is applied. Accordingly, passively performing the aforementioned partial curing in situ will generally be economically impractical, and curing at a higher temperature will generally require transport of the light emitting device 200 to an oven.

In an embodiment of this invention, an ultra-violet curable adhesive 130 may be used. While the mechanism that accurately attaches the lens element 210 to the substrate 110 is still attached to the lens element 210, the light emitting device is exposed to ultra-violet light for a brief period of time, sufficient to bring the shear strength to an intermediate level that will assure a bond that will be unaffected by transport or other mechanical or environment effects. The particular intermediate shear strength level will be dependent upon the expected shear forces that the particular subsequent processes are likely to produce, but a shear strength of about 1 kgf is generally sufficient. The source of the ultra-violet light may be provided by the mechanism that attaches the lens element 210 to the substrate 110, or by a separate device. In the alternative the light emitting element 120 may emit sufficient UV light to cure the adhesive.

The UV curing of the adhesive 130 generates heat and expands the air within the cavity 230. In embodiments of this invention, the presence of the gap 135 in the adhesive 130 around the cavity 230 allows the expanded air to escape, eliminating the pressures that are commonly experience during the curing of the lens attachment of conventional light emitting devices.

After this initial partial cure, the light emitting device 200 may be transported to a mechanism that efficiently provides a full cure of the adhesive 130, typically an oven. A full cure will generally provide a shear strength of over 5 kgf, which generally maintains the alignment accuracy through most, if not all, applications.

Although it may be preferable to seal the gap 135 in the adhesive 130 after the full cure of the adhesive 130, in most cases, applying a sealing material to the fully cured adhesive 130 may not provide a sufficient bond to reliably isolate the light emitting element from the surrounding environment. Accordingly, in some embodiments, the gap 135 may be sealed while the adhesive 130 is in the semi-cured state, before being subjected to the full thermal cure. As noted above, the partial cure provides a shear strength of 1 kgf or more, which will be sufficient to overcome the lateral forces that may be produced as the air in the sealed cavity is heated during the full thermal cure.

FIG. 3 illustrates an example light emitting device 300 that includes sealing material 320 that seals the gap (135 in FIGS. 2B, 2C) in the adhesive strip 130. In this manner, the light emitting element 120 is isolated from the surrounding environment.

FIG. 4 illustrates an example flow diagram for forming a light emitting device with a high alignment accuracy between a lens element and a light emitting element.

At 410, the light emitting element is fixedly attached to a substrate. The substrate includes conductors that enable the light emitting element to receive power from an external source. The substrate may also include features that facilitate alignment of the lens that will cover the light emitting element, and/or alignment of the substrate with another structure, such as a lamp fixture.

At 420, an adhesive is applied around the light emitting element, but not completely surrounding it, leaving a gap. The adhesive may be applied using a stamp tool, or other dispenser that can create the desired pattern. The size of the gap is dependent upon the expected flow of the adhesive as the lens is attached. The gap should be wide enough so that even if the adhesive flows into the gap from each side of the gap as the lens is attached, it will not seal the gap, creating a vent hole. The thickness of the adhesive will also determine the size of the resultant vent hole when the lens is attached. In one embodiment, an adhesive thickness of about 30 to 50 μm may be used.

At 430, a pick-and-place apparatus may be used to place the lens element upon the adhesive, aligned with the light emitting element. The alignment may be accomplished by optically determining where a feature of the light emitting element is located, or by mechanical alignment to physical features on the substrate.

While the lens element is still held by the apparatus that placed the lens element onto/into the adhesive, at 440, the adhesive is partially cured. A UV-curable adhesive may be snap-cured by exposing it to UV light for a short period of time. The intensity of the UV light, the thickness of the adhesive, and the duration of exposure will determine the resultant shear strength of the partially cured adhesive. The manufacturer of the adhesive is generally able to provide appropriate tables and/or charts that enable the determination of these factors. So as not to significantly delay the manufacturing process, an adhesive that can be cured to provide a shear strength of 1 kgf in the order of seconds may be used, such as 3M™ Adhesive Sealant Fast Cure 4000UV.

Because the adhesive is partially cured to provide a sufficient shear strength, after release of the lens element by the placement apparatus, at 450, the alignment of the lens and the light emitting element will be maintained throughout the subsequent manufacturing processes.

If a bond of a sealing material to the fully cured adhesive is not expected to provide a reliable seal of the venting hole provided by the gap in the patterned adhesive, the venting hole is sealed with a sealing material while the patterned adhesive is in the partially cured state, at 460. Any of a variety of sealant materials that are compatible with the materials of the lens and the substrate may be used, including, for example, the same material that is used for the patterned adhesive, such as 3M™ Adhesive Sealant Fast Cure 4000UV. The subsequent curing of the adhesive, at 470, will assure a reliable bond between the adhesive and the sealing material, as well as further increasing the shear strength of the adhesive, typically to about 5 kgf.

Thereafter, the assembled substrate with light emitting element and lens may be further processed, at 480, including, for example, slicing and dicing (singulating) individual light emitting devices if the substrate had included a plurality of light emitting elements that are now sealed within a corresponding plurality of lens elements.

While the invention has been illustrated and described in detail in the drawings and foregoing description, such illustration and description are to be considered illustrative or exemplary and not restrictive; the invention is not limited to the disclosed embodiments.

For example, although this invention is particularly well suited for achieving a highly accurate alignment of the lens and the light emitting element, one of skill in the art will recognize that this technique may be used in less exacting applications, to substantially reduce the stress that is placed on the lens during the conventional lens-attach process.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A light emitting device comprising:
   a substrate;
   a light emitting element situated on the substrate;
   a lens element having a cavity within which the light emitting element is situated, an exterior surface, a bottom surface for mounting the lens element, and an interior surface;
   an adhesive that surrounds a majority of a perimeter of the light emitting element, but does not completely surround the perimeter of the light emitting element to form a gap in the adhesive, the gap being positioned between an upper surface of the substrate and the bottom surface of the lens element to connect the cavity to an exterior of the lens element, the adhesive being disposed in a plane parallel to a light emitting surface of the light emitting element, the adhesive attaching the bottom surface of the lens element to the upper surface of the substrate; and
   a sealing material that is situated within the gap in the adhesive, the sealing material sealing the cavity.

2. The device of claim 1, wherein the lens element includes at least one feature that aligns the lens element on the substrate with respect to the light emitting element.

3. The device of claim 1, wherein the substrate includes at least one feature that aligns the lens element with respect to the substrate.

4. The device of claim 1, wherein the substrate includes at least one feature that aligns the substrate with respect to another substrate.

5. The device of claim 1, wherein the lens element is patterned to alter directions of emissions from the light emitting element.

6. The device of claim 5, wherein the exterior surface of the lens element is patterned to alter the directions of emissions from the light emitting element.

7. The device of claim 5, wherein the interior surface of the lens element is patterned to alter the directions of emissions from the light emitting element.

8. The device of claim 5, wherein the lens element is patterned to collimate the directions of emissions from the light emitting element.

9. The device of claim 1, wherein the lens element includes a wavelength conversion material.

10. The device of claim 1, wherein the cavity of the lens element includes a wavelength conversion material.

11. The device of claim 1, wherein the adhesive is an ultra-violet curable adhesive.

12. The device of claim 1, wherein the adhesive and the sealing material comprise the same material.

13. The light emitting device of claim 1, wherein the cavity is an air cavity.

14. A method comprising:
    providing a light emitting element on a substrate;
    partially surrounding the light emitting element with an adhesive on the substrate, leaving a gap;
    attaching a lens with a cavity for containing the light emitting element to the adhesive on the substrate, such that the gap in the adhesive allows air to escape from the cavity; and
    partially curing the adhesive on the substrate to prevent subsequent displacement of the lens with respect to the light emitting element.

15. The method of claim 14, including sealing the gap with a sealing material after the partial curing of the adhesive.

16. The method of claim 15, including fully curing the adhesive after sealing the gap.

17. The method of claim 14, wherein partially curing the adhesive is performed in situ, and a position of the substrate is not moved between attaching the lens and partially curing the adhesive.

18. The method of claim 14, wherein the gap extends from the cavity to an exterior of the lens.

19. The method of claim 14, wherein while partially curing the adhesive on the substrate, air moves between the cavity and an exterior of the lens through the gap.

* * * * *